United States Patent
Subramanian et al.

[11] Patent Number: 6,127,089
[45] Date of Patent: Oct. 3, 2000

[54] INTERCONNECT STRUCTURE WITH LOW K DIELECTRIC MATERIALS AND METHOD OF MAKING THE SAME WITH SINGLE AND DUAL DAMASCENE TECHNIQUES

[75] Inventors: Ramkumar Subramanian, San Jose; Christopher F. Lyons, Fremont; Uzodinma Okoroanyanwu, Mountain View, all of Calif.

[73] Assignee: Advanced Micro Devices, Inc., Sunnyvale, Calif.

[21] Appl. No.: 09/143,105

[22] Filed: Aug. 28, 1998

[51] Int. Cl.[7] .................................................. G03C 1/76
[52] U.S. Cl. ........................ 430/270; 430/271; 438/637; 438/620; 438/624
[58] Field of Search ..................... 430/325, 270, 430/170, 271, 192, 176, 280, 281; 438/619, 620, 621, 622, 623, 624, 637

[56] References Cited

U.S. PATENT DOCUMENTS

| | | | |
|---|---|---|---|
| 4,440,850 | 4/1984 | Paul et al. ............................... | 430/325 |
| 4,491,628 | 1/1985 | Ito et al. ................................. | 430/176 |
| 4,690,838 | 9/1987 | Hiraoka et al. ......................... | 427/343 |
| 4,849,320 | 7/1989 | Irving et al. ............................ | 430/280 |
| 5,164,278 | 11/1992 | Brunsvold et al. ..................... | 430/176 |
| 5,248,734 | 9/1993 | Ober et al. ............................. | 525/328 |
| 5,258,257 | 11/1993 | Sinta et al. ............................. | 430/192 |
| 5,344,742 | 9/1994 | Sinta et al. ............................. | 430/270 |
| 5,393,642 | 2/1995 | DuBois et al. ......................... | 430/271 |
| 5,525,453 | 6/1996 | Przybilla et al. ....................... | 430/170 |
| 5,556,734 | 9/1996 | Yamachika et al. ................... | 430/270 |
| 5,641,712 | 6/1997 | Grivna et al. .......................... | 438/624 |
| 5,677,241 | 10/1997 | Manning ................................ | 437/195 |
| 5,691,573 | 11/1997 | Avanzino et al. ...................... | 257/758 |
| 5,773,361 | 6/1998 | Cronin et al. .......................... | 438/637 |
| 5,776,657 | 7/1998 | Schaedeli et al. ..................... | 430/281 |
| 5,879,856 | 3/1999 | Thackeray et al. .................... | 430/270 |
| 5,880,018 | 3/1999 | Boeck et al. ........................... | 438/619 |

*Primary Examiner*—Charles Bowers
*Assistant Examiner*—Laura Schillinger

[57] ABSTRACT

A damascene structure and method of making the same in a low k dielectric material employs an imageable layer in which the damascene pattern is provided. The imageable layer is a convertible layer that upon exposure to the plasma etch that etches the low k dielectric material, converts the silicon-rich imageble layer into a mask layer containing silicon dioxide, for example. The low k dielectric material is protected from further etching by the mask thus created.

9 Claims, 7 Drawing Sheets

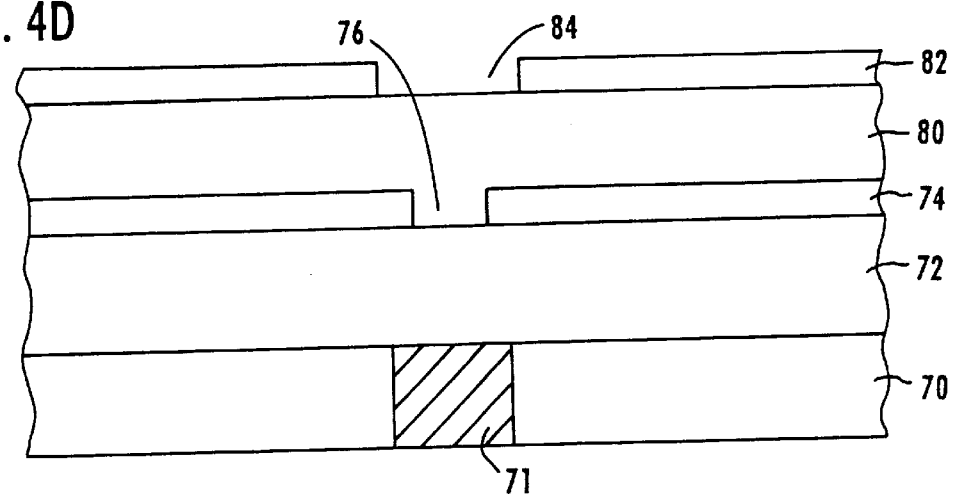
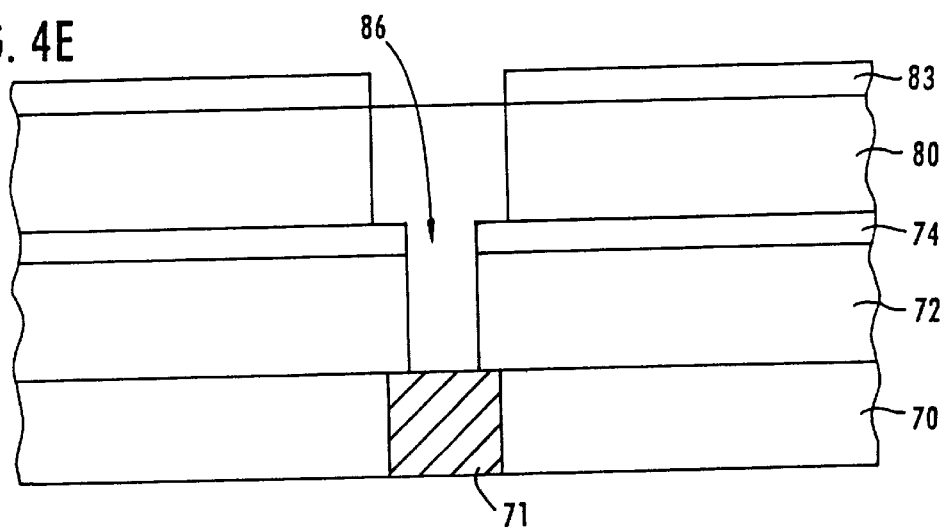
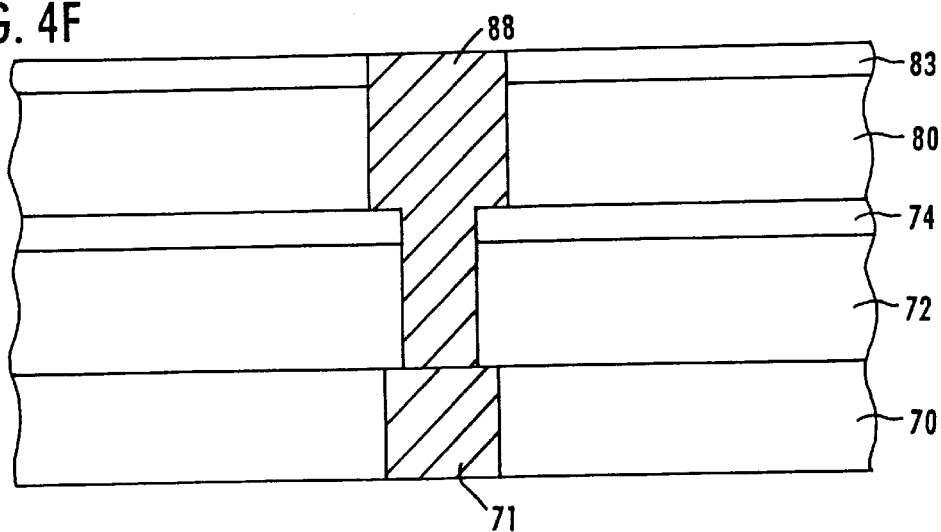

6,127,089

INTERCONNECT STRUCTURE WITH LOW K DIELECTRIC MATERIALS AND METHOD OF MAKING THE SAME WITH SINGLE AND DUAL DAMASCENE TECHNIQUES

FIELD OF THE INVENTION

The present invention relates to the field of interconnects in semiconductor devices, and more particularly, to methods for forming single damascene and dual damascene structures in low dielectric constant materials.

BACKGROUND OF THE INVENTION

Integrated circuit fabrication typically begins with a thin, polished slice of high-purity, single crystal semiconductor material, usually silicon. Junctions (which make up devices) are formed between field oxide portions of the semiconductor slice. Metal lines in conductor layers provide necessary electrical connections between the devices. Dielectric (i.e. insulating) layers are formed between the conductor layers to isolate the metal lines from each other. Vias provide conducting paths through the dielectric layers to connect the interconnects of different conductor layers.

In high performance integrated circuits in the sub-0.25 $\mu$m regime, there is a need to fabricate interconnects using so-called damascene techniques. This is because conventional deposition and etching of aluminum-based metalization becomes increasingly difficult at these feature sizes. At the same time, performance considerations call for the use of lower resistivity metals such as copper, which has proven virtually impossible to pattern using conventional reactive ion etching. The desire to use copper for interconnects has increased the attractiveness of damascene techniques and spurred investigation into improving these techniques.

In addition to using low resistivity metals such as copper, circuit performance enhancement has been sought by combining the copper conductors with low dielectric constant insulators (k less than approximately 4). In many cases, these low k materials are spin coated polymers which are incompatible with conventional photoresist stripping using oxygen ashers or solvents. The patterning of the low k materials to form the trenches and vias of a damascene formation is a difficult task due to the incompatibility of the low k materials with conventional photoresist stripping.

An example of a single damascene process using a low k dielectric material is depicted in FIGS. 1A through 1D. A low k dielectric material 42 such as benzocyclobutene (BCB), hydrogen silsesquioxane (HSQ) or the material known as FLARE (manufactured by Allied Signal) is spun on an interconnect layer 40. A cap layer 44 is then deposited on the low k dielectric layer 42. The cap layer 44 may be a 2000 Å thick layer of TEOS, or a multiple layer cap layer. For example, a multiple layer cap layer 44 may have: a bottom 2000 Å thick TEOS layer, a 1000 Å nitride middle layer and a 800 Å thick top layer that is an organic bottom anti-reflective coating (BARC). A photoresist layer 46 is then deposited, leaving the structure of FIG. 1A.

The photoresist layer 46 is then patterned with the desired pattern and after developing, the cap layer 44 is etched, resulting in the structure of FIG. 1B. The etch recipe for the cap layer 44 is a different one than for the low k delectric layer 42, which is an organic etch.

The photoresist layer 46 is then stripped off, using an appropriate oxygen ashing and/or solvent technique. This results in the structure of FIG. 1C. The cap layer 44 is used as a hard mask to pattern the low k dielectric layer 42 by an organic etch. This results in the structure of FIG. 1D. The cap layer 44 may be retained if it is TEOS only, although interconnect capacitance increases with TEOS thickness. The cap layer 44 is stripped if a multiple layer hard mask is employed.

An example of a dual damascene process sequence using a low k dielectric, having trenches with underlying via holes that are etched in the low k dielectric material before metal deposition and chemical-mechanical polishing (CMP), is depicted in FIGS. 2A–2D. This commonly used method of forming the trenches together with the via holes employs etch stop layers and photoresist masks. A bottom stop layer 14, such as silicon nitride, has been deposited over an existing interconnect pattern formed in an interconnect layer 10. The interconnect pattern may be formed from a conductor 12, such as copper. A layer of low k dielectric material 16 is then deposited on the bottom stop layer 14. The via will be formed within this low k dielectric layer 16.

A middle stop layer 18, such as silicon dioxide, is deposited over the low k dielectric layer 16. A via pattern 20 is etched into the middle stop layer 18 using conventional photolithography and appropriate anisotropic dry etching techniques. (These steps are not depicted in FIG. 2A. Only the resultant via pattern 20 is depicted in FIG. 2A.) The photoresist used in the via patterning is removed by an oxygen plasma, which consumes some of the exposed low k material, as indicated in FIG. 2A.

FIG. 2B depicts the structure of FIG. 2A after a second layer 22 of low k dielectric material has been spin coated on the middle stop layer 18 and through the via pattern opening 20. The structure is planarized at the same time. Following the spin coating and the planarization of the low k dielectric layer 22 in which the trench will be formed, a hard mask layer 24 is deposited. The hard mask layer 24 may be silicon dioxide, for example.

The trench pattern is then formed in a photoresist layer (not depicted) which is aligned over the via pattern, using conventional photolithography. The structure is then exposed to an anisotropic dry etch configured to etch through the hard mask layer 24. The etch chemistry is then changed to one which selectively etches the low k dielectric material in the low k dielectric layer 22, but not the hard mask layer 24 nor the middle and bottom stop layers, 18 and 14. In this way, a trench 26 and a via 28 are formed in the same etching operation.

In most cases, the low k etch chemistry etches the photoresist at approximately the same rate as the low k dielectric. The thickness of the trench photoresist is selected to be completely consumed by the end of the etch operation, to eliminate the need for photoresist stripping. This results in the structure depicted in FIG. 2C, in which all of the photoresist has been stripped and the trench 26 and via 28 have been formed. The bottom stop layer 14 is then removed by a different selective dry etch chemistry designed not to attack any other layers in order to expose conductor 12 to which the via is making a connection. The resulting structure is depicted in FIG. 2D. The bottom stop layer is normally used to protect the pre-existing interconnect layer from oxidation or corrosion during dry etching. If such concerns do not exist, bottom stop layer 14 and the corresponding bottom stop etching step is omitted.

In the known single and dual damascene processing techniques described above, the low k dielectric material is protected during removal of the photoresist by a mask (or cap) layer, formed of silicon dioxide or TEOS, for example. The patterning of the mask layer involves the separate steps of depositing and patterning a photoresist, and using the patterned photoresist in the etching of the mask layer. Hence, the need to protect the low k material during photoresist removal and pattern the protective mask adds a number of steps to the manufacturing process and therefore increases cost.

SUMMARY OF THE INVENTION

There is a need for a method of producing damascene structures in an interconnected arrangement incorporating low k dielectric materials with a reduced number of process steps while still protecting the low k dielectric layers from unintended etching and removal.

This and other needs are met by the present invention which provides a method of forming a damascene structure in a semiconductor device comprising the steps of forming a first low k dielectric layer and depositing an imageable layer on the first low k dielectric layer. The imageable layer is then patterned to create an opening in the imageable layer. The first low k dielectric layer is etched through the opening in the imageable layer. This etching transforms the imageable layer into a hard mask layer.

In certain embodiments, the imageable layer is a silicon-rich photopolymer that includes at least 20% silicon. When exposed to the etching step that etches the first low k dielectric layer, the silicon-rich photopolymer is at least partially converted to silicon dioxide, which acts as a hard mask to protect the unexposed portions of the first low k dielectric layer. Hence, a simple oxygen plasma etch simultaneously is used in a single step to etch low k dielectric material and convert the photopolymer to a hard mask. Since the silicon rich polymer has a very etch resistance, only a thin layer (e.g. about 250 nm) may be used as the mask layer. The converted silicon dioxide may then be serve as the mask layer. The converted silicon dioxide does not need to be stripped and can remain in place since it is a dielectric material itself. Also, since only a thin layer of the silicon rich polymer is originally deposited, the interconnect capacitance will not be greatly increased by the retention of this layer within the interconnect structure. This compares favorably with prior art structures which employ silicon dioxide layers (such as TEOS) of 2,000 Å thickness that remain in place in the final arrangement.

The earlier stated needs are met by another embodiment of the present invention in which a dual damascene structure is created by forming a second low k dielectric layer on the first imageable layer, and then depositing a second imageable layer on the second low k dielectric layer. The second imageable layer is patterned to create a trench opening in the second imageable layer, with at least a portion of the trench opening overlaying the via opening that was created in the first low k dielectric layer. The first and second low k dielectric layers are etched through the trench opening and the via opening. The etching process transforms the second imageable layer and portions of the first imageable layer exposed by the trench opening into hard mask regions.

The present invention has the advantage of reducing the number of process steps required to create a dual damascene structure while protecting the low k dielectric material in the arrangement. This is due to avoiding the use of conventional photoresist material and the stripping steps required to remove this material. Instead, a single imageable layer is used on the low k dielectric material. The second imageable layer is patterned to create a trench opening in the second imageable layer, with at least a portion of the trench opening overlaying the via opening that was created in the first low k dielectric layer. The first and second low k dielectric layers are etched through the trench opening and the via opening. The etching process transforms the second imageable layer and portions of the first imageable layer exposed by the trench opening into hard mask regions.

The present invention has the advantage of reducing the number of process steps required to create a dual damascene structure while protecting the low k dielectric material in the arrangement. This is due to avoiding the use of conventional photoresist material and the stripping required to remove this material. Instead, a single imageable layer is used on the low k dielectric material that can be imaged into a pattern and in a simultaneous step be transformed into a hard mask layer while the low k dielectric material is etched through the opening in the imageable layer.

In addition to the methods for creating damascene structures provided by the present invention, the earlier stated needs are also met by an interconnect arrangement in a semiconductor device comprising a first low k dielectric layer and a first silicon-rich mask layer that is less than about 400 nm thick on the first low k dielectric layer. The first low k dielectric layer has a via. A second low k dielectric layer is on the first silicon-rich mask layer. A second silicon-rich mask layer that is about 400 nm thick is provided on the second low k dielectric layer. A trench is provided in the second low k dielectric layer.

The interconnect arrangement of the present invention has a very thin layer separating the first and second low k dielectric layers, much thinner than prior arrangements which employ a silicon dioxide layer of approximately 2,000 Å. By reducing the thickness of the mask layer between the dielectric layers, the total capacitance of the interconnect arrangement is reduced according to the present invention. In certain preferred embodiments, the thickness of the silicon-rich mask layer is about 250 nm.

In certain other embodiments of the present invention, an interconnect structure is provided having a first low k dielectric layer and an imageable layer directly on the first low k dielectric layer. This imageable layer is convertible to a hard mask layer.

The use of an imageable layer that is convertible to a hard mask layer provides dual functionality in a single layer, (i.e. imaging and masking) to allow reduction in the number of processing steps and simplification of the procedure in which organic low k dielectric material need to be protected from consumption by exposure to oxygen. If conventional photoresist stripping is employed as in the prior art, for example, the organic low k dielectric material would be consumed without appropriate masking. This is avoided by the present invention in which the imageable layer protects the low k dielectric material and is actually converted into a mask layer during the process in which the low k dielectric material is etched.

The foregoing and other features, aspects and advantages of the present invention will become apparent from the following detailed description of the present invention when taken in conjunction with the accompanying drawings.

BRIEF DESCRIPTION OF THE DRAWINGS

FIGS. 4A–4F depict cross-sectional views of the interconnect portion of the semiconductor wafer during a manufacturing process thereof to form a dual damascene structure with trench and via formation in accordance with embodiments of the present invention.

DETAILED DESCRIPTION OF THE INVENTION

The present invention, with embodiments depicted in FIGS. 3A–3I and 4A–4F, provide processing sequences forming single damascene and dual damascene trench and via structures in low k dielectric materials. The embodiments of the present invention ensure that a low k dielectric material is not completely consumed during the patterning of the openings to be created, nor during the etching of the openings in the low k dielectric layers. This is accomplished through the use of a relatively thin, imageable layer formed on top of the low k dielectric layers, and which is convertible to a mask layer during the etching of the low k dielectric material.

Figure 1A:
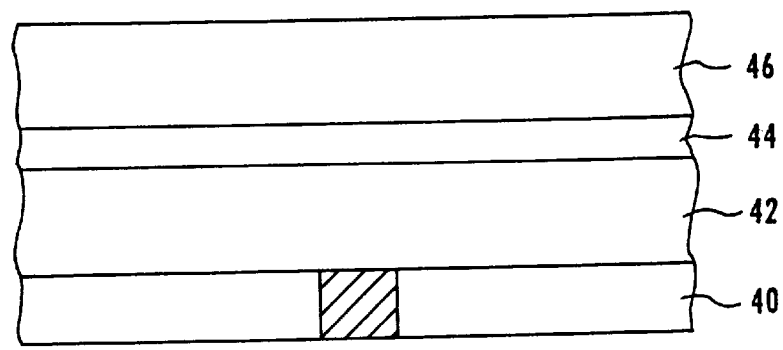
FIGS. 1A–1D depict a method of forming an opening in a low k dielectric material in accordance with known methods.
Figure 1B:
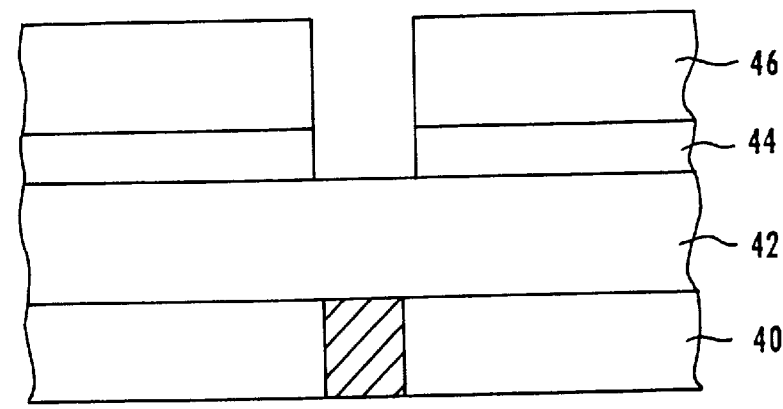
Figure 1C:
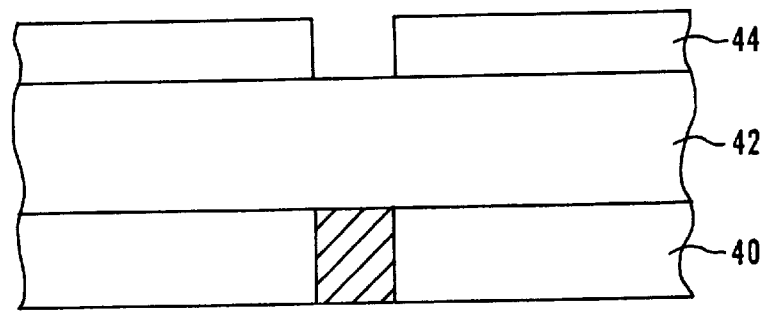
Figure 1D:
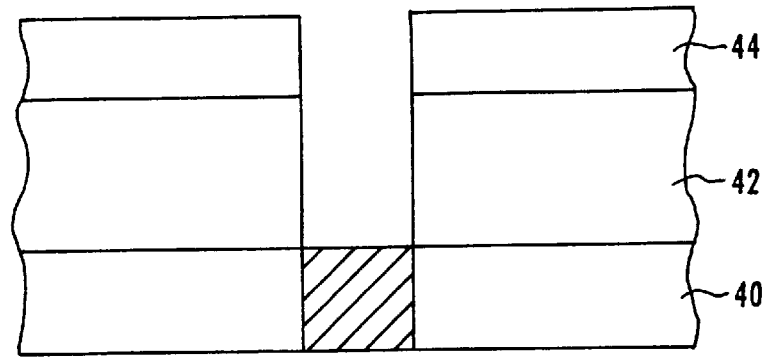
Figure 2A:
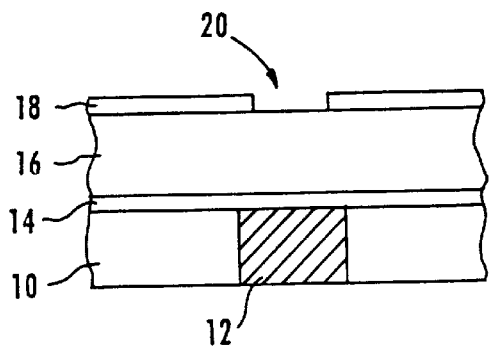
FIGS. 2A–2D depict a method of forming a dual damascene trench and via structure in a low k dielectric material in accordance with prior art methods of processing.
Figure 2B:
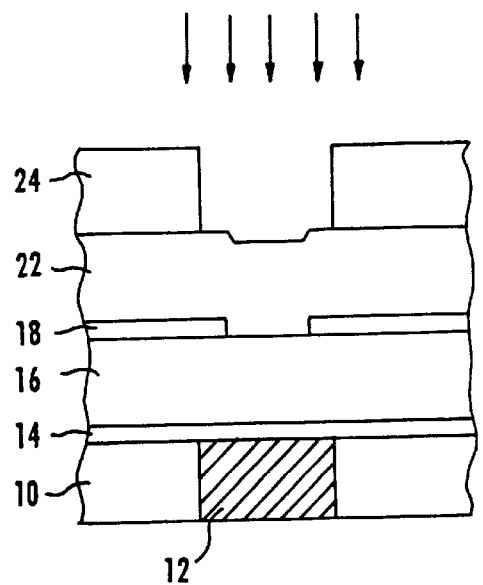
Figure 2C:
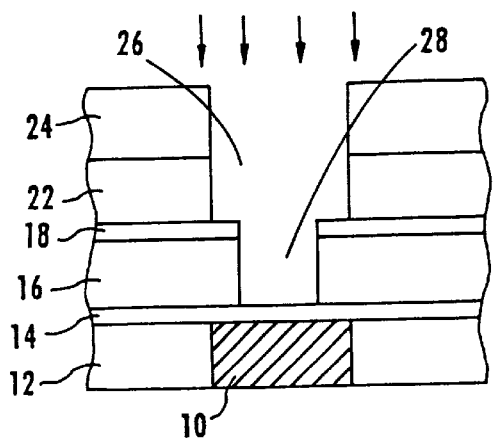
Figure 2D:
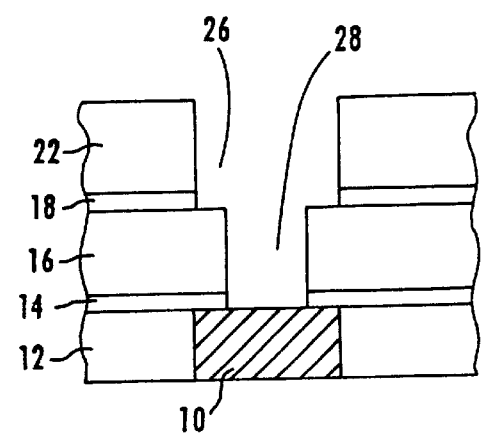
Figure 3A:
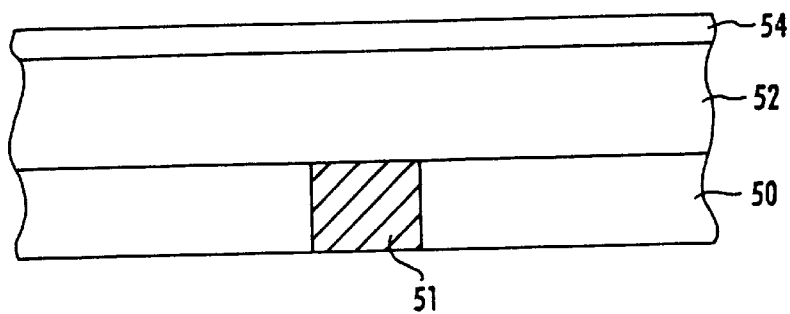
FIGS. 3A–3I depict cross-sectional views of the interconnect portion of a semiconductor wafer during a manufacturing process thereof to form a single damascene structure with trench and via formation in accordance with certain embodiments of the present invention.

A first embodiment of the present invention is depicted in FIGS. 3A–3I, which show a cross-section of a interconnect portion of a semiconductor wafer, for example as shown in FIG. 3A. A conductor 51 having a low resistivity, such as copper, is provided in an interconnect layer 50. A first low k dielectric layer 52 is then formed by spin coating, for example, low k dielectric material on the interconnect layer 50 and conductor 51. The first low k dielectric layer 52 may be made of a suitable material, such as benzocyclobutene (BCB), hydrogen silsesquioxane (HSQ) or the commercially known material FLARE manufactured by Allied Signal. These materials are considered low k dielectric materials since their dielectric constant is less than about 4. Although these materials have proven advantageous in reducing the capacitance of the interconnect region, this class of materials is more difficult to work with since conventional techniques for removing photoresist (oxygen ashing or solvents) tend to consume the organic low k dielectric materials. Hence, during normal processing, low k dielectric layer 52 needs to be protected from oxygen ashing.

A thin layer of a silicon-rich polymer 54 that is an aromatic based polymer, for example, is deposited on the low k dielectric layer 52. A suitable material is that found in the top layer of a bilayer resist made by Olin Microelectronic Materials of East Providence, R.I. The planarizing layer typically found in a bilayer resist is not required in the present invention as the low k dielectric layer 52 serves in the capacity of a planarizing layer commonly found in the bilayer resists. Instead, the silicon-rich polymer layer 54 is an imageable layer used in a bilayer resist. The low k dielectric 52 is typically deposited to a thickness of about 7,000 Å, and in the present invention, the thickness of the imageable layer 54 is approximately 250 nm. This compares favorably with cap layers of approximately 2,000 Å of silicon dioxide that are used to cap low k dielectric layers in the prior art. The reduced thickness of the imageable layer 54 leads to a reduction in the overall capacitance of the interconnect layers.

An example of an imageable layer that may be used in the present invention is an acrylate polymer having the structure shown below:

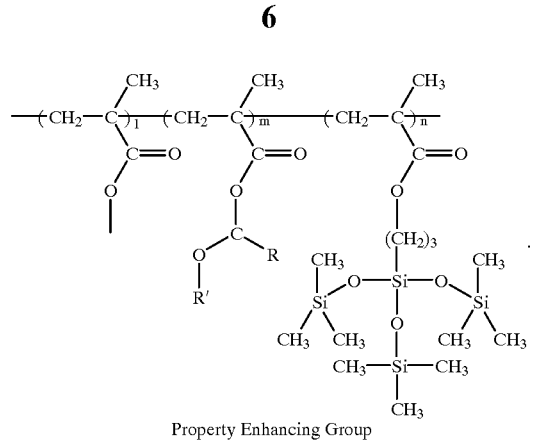

Property Enhancing Group

The property enhancing group may be selected by one of ordinary skill in the art to enhance the sensitivity of the imageable layer to react with light, or to be patterned by chemical processes.

Although a specific embodiment of an imageable layer is described, this embodiment is exemplary only as other imageable layers may be used in the present invention without departing from the spirit or scope of the present invention.

Figure 3B:
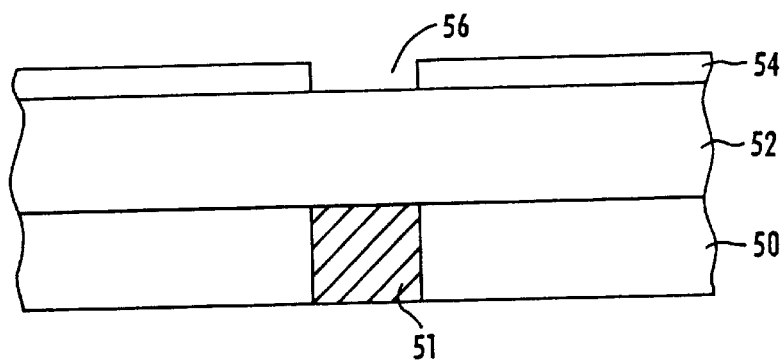

FIG. 3B depicts the cross-section of the interconnect structure after the imageable layer has been patterned and developed. A via pattern 56 has been patterned into the imageable layer 54 through conventional patterning and stripping techniques.

With the via pattern now formed in the imagable layer 54, the low k dielectric layer 52 is now etched to create the via opening 58. The etching may be done, for example, using a single oxygen plasma etch. The oxygen plasma etch, in addition to etching the organic low k dielectric layer 52, will convert the silicon-rich polymer of the imageable layer 54 into silicon dioxide, thereby transforming the imageable layer 54 into a mask layer 55. The polymer in the imageable 54 in preferred embodiments has a concentration of silicon of at least 20% and more preferably 25%. A relatively thin layer, e.g. about 250 nm, may be employed since the silicon-rich polymer in the imageable layer 54 has a very high etch resistance.

Figure 3C:
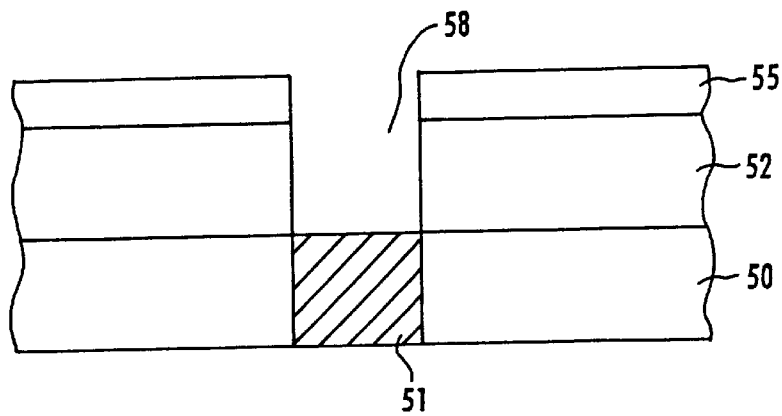
Figure 3D:
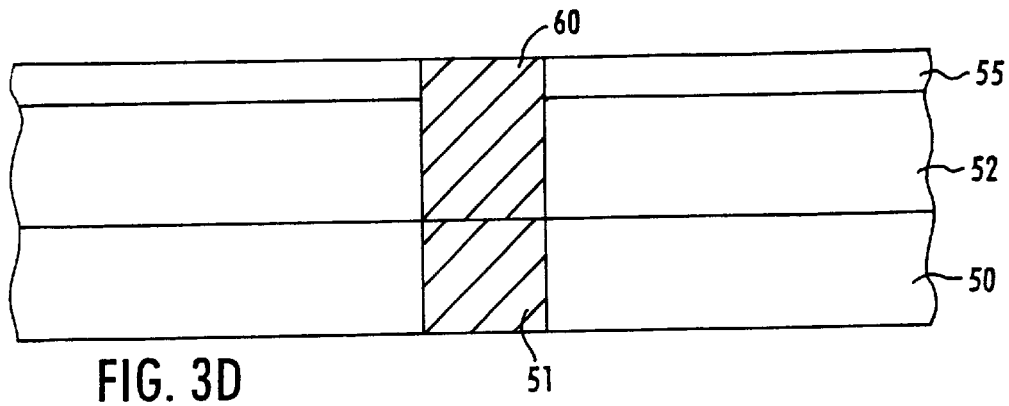
Figure 3E:
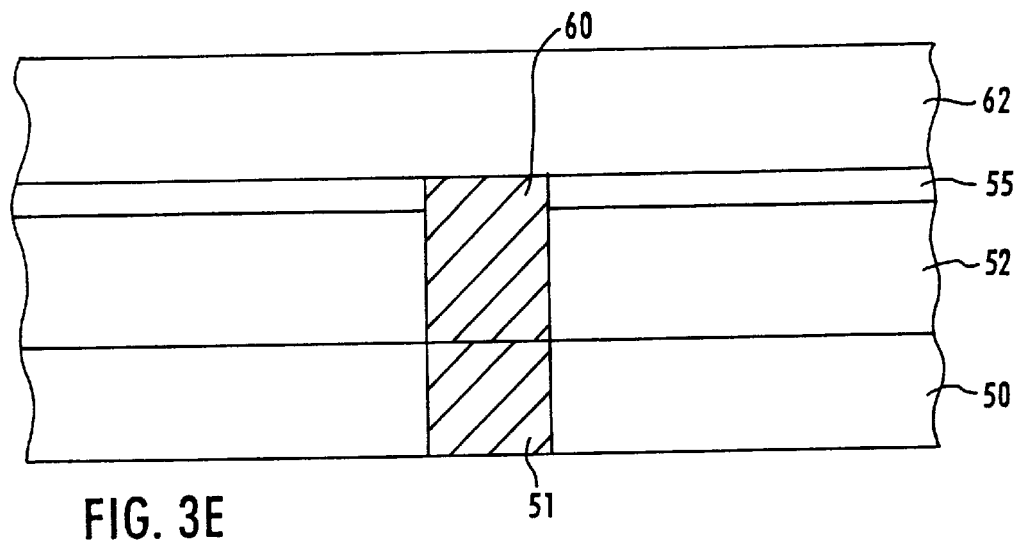

FIG. 3D depicts the structure of FIG. 3C after the via hole 58 has been filled with a conductive material to form a via 60. The filling of the via hole 58 with conductive material 60 may be performed in a conventional manner, such as by deposition of copper, with or without a barrier layer.

After formation of the via 60, a second low k dielectric layer 62 is spun on the mask layer 55 and the via 60. The mask layer 55, formerly the imageable layer 54 and now converted into silicon dioxide during the etching of low k dielectric layer, remains in place and is not stripped prior to formation of the second low k dielectric layer 62. This is because the mask layer 55 is also a dielectric layer, although it has a higher dielectric constant than the low k dielectric material. However, the total capacitance of the interconnect layer is not greatly increased since a thin layer (e.g. about 250 nm) is used. The material comprising the second low k dielectric layer 62 may be the same material comprising the first low k dielectric layer 52. In other words, an organic low k dielectric material such as BCB, HSQ or FLARE may be employed. It is preferable for efficient processing to employ the same low k dielectric material.

Figure 3F:
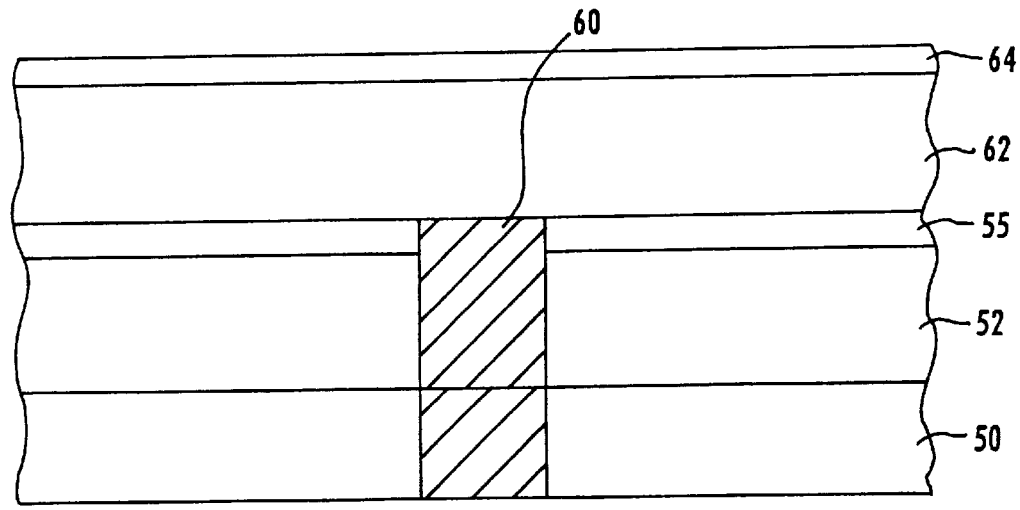

As done earlier for the first low k dielectric layer 52, a second imageable layer 64 is deposited on the second low k dielectric layer 62. This second imageable layer 64 may be made of the same material as the first imageable layer 54 (now mask layer 55). The second low k dielectric layer 62 may hive a thickness of approximately 7,000 Å in preferred embodiments, while the thickness of the second imageable layer 64 may be approximately 250 nm in certain preferred embodiments of the invention. In other embodiments of the invention, the first and second imageable layers 54, 64, have thicknesses of less than 400 nm. The resulting structure is depicted in FIG. 3F.

Figure 3G:
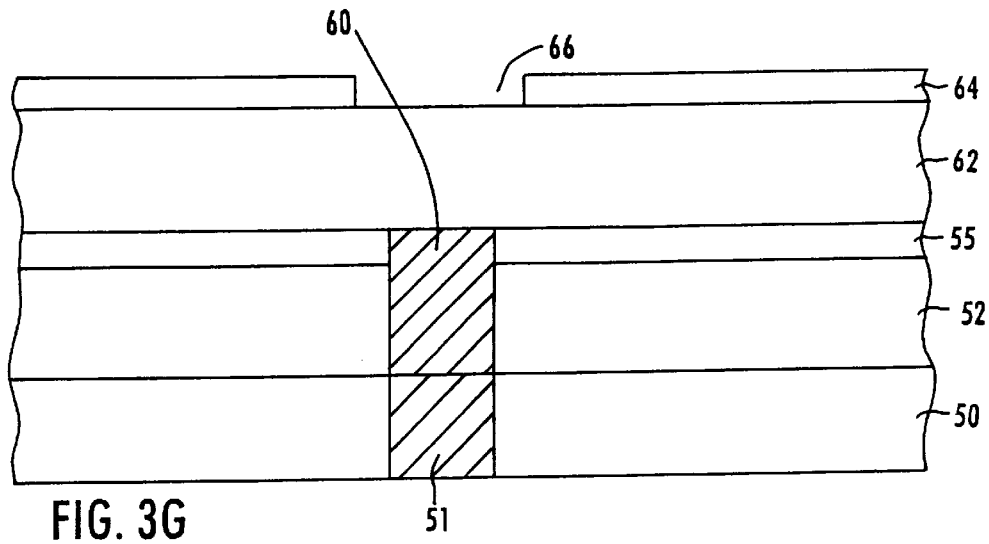

The second imageable layer 64 is patterned and developed as depicted in FIG. 3G, to provide a trench opening 66. The patterning process to create the trench opening 66 is selected so as not to attack the low k dielectric material in the second low k dielectric layer 62. The trench opening 66 at least partially overlays the via 60.

Figure 3H:
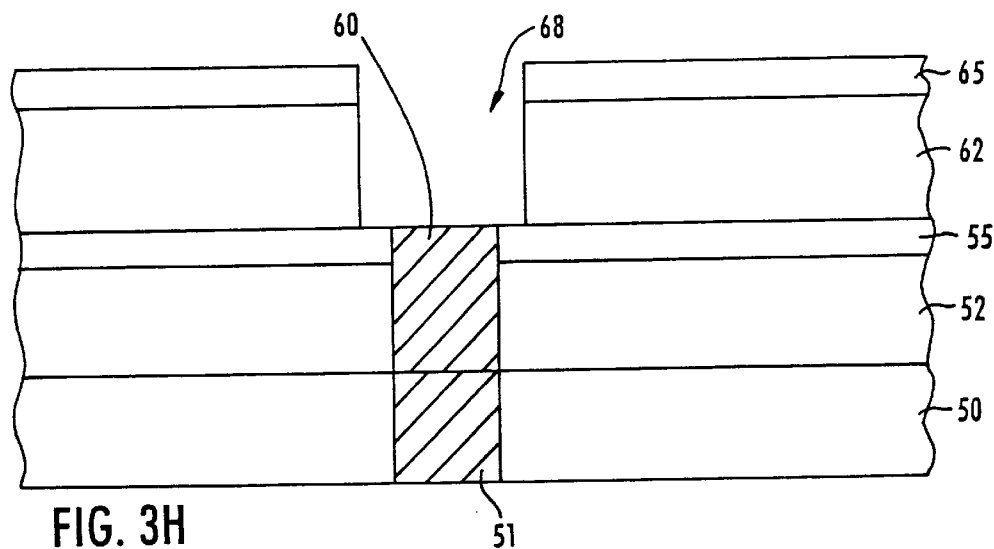
Figure 3I:
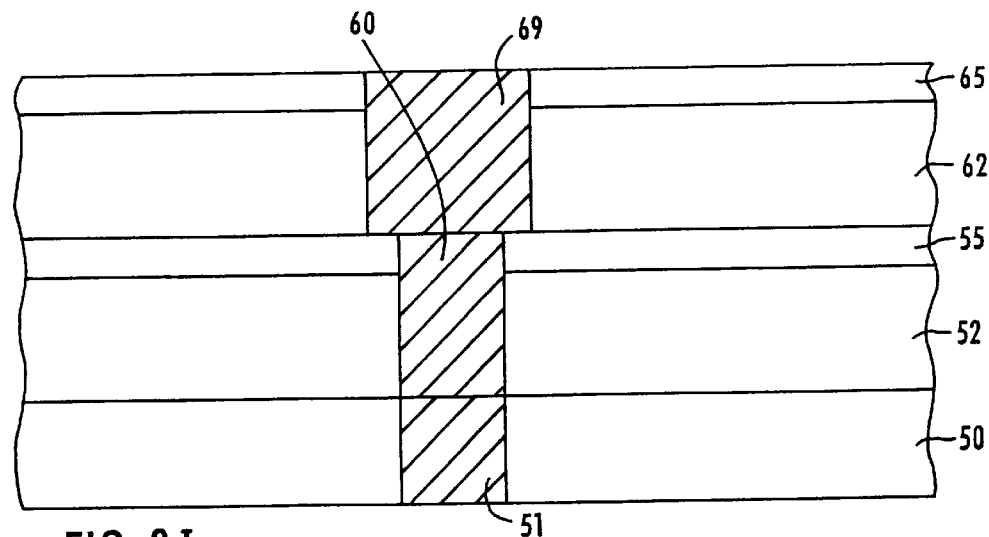

FIG. 3H depicts the structure of FIG. 3G following the etching of the second lo w k dielectric layer 62. An oxygen plasma etch is used as the etching chemistry in certain preferred embodiments. A trench 68 is created, and at the same time, the second imageable layer 64 is converted into a mask layer 65 comprising silicon dioxide. This mask layer 65 serves to protect the low k dielectric material in the second low k dielectric layer 62 located immediately beneath the mask layer 65. Those portions of the second low k dielectric layer 62 not covered by the mask layer 65 are etched. The resultant structure is depicted in FIG. 3H.

In order to complete the single damascene structure, conductive material is deposited within the trench opening 68 to form the trench 69. The conductive material may be a low resistivity material, such as copper, for example.

One of the main advantages of the dual damascene technique over the single damascene technique is the etching of the dielectric layers in a single step, and the filling of the trench and via with conductive materials in a single step, thereby reducing the total number of steps employed in the damascene process. Certain embodiments of the present invention provide a method of forming the interconnect structure using a dual damascene technique.

Figure 4A:
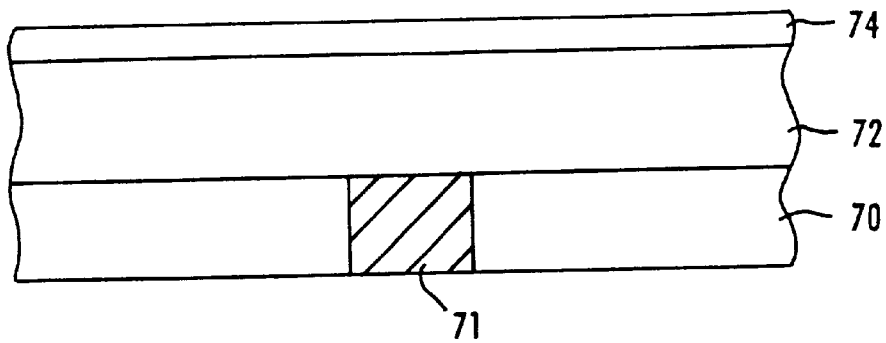

In FIG. 4A, a first dielectric layer 72 is formed (such as by spinning on) interconnect layer 70 having a conductor 71. The first imageable layer 74 is deposited on the first low k dielectric layer 72. In the exemplary embodiment of the dual damascene process of the present invention depicted in FIGS. 4A–4F, the same materials may be employed in the layers as already described with respect to the single damascene process depicted in FIGS. 3A–3I. Hence, the description of these materials with respect to the dual damascene process in FIGS. 4A–4F will not be provided.

Figure 4B:
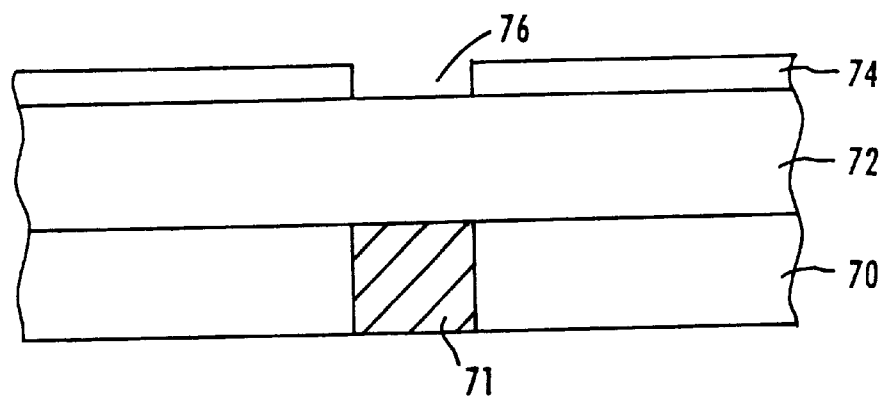
Figure 4C:
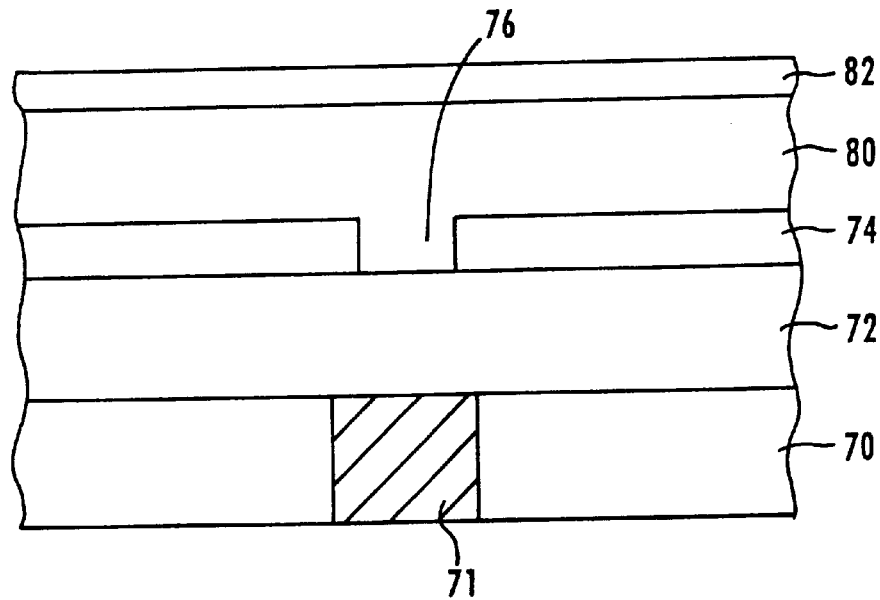

FIG. 4B depicts the structure of FIG. 4A after the first imageable layer 74 has been patterned to create a via pattern 76. Instead of performing an oxygen plasma etch of the first low k dielectric layer 72 as done in the single damascene process, a second low k dielectric layer 80 is deposited over the first imageable layer 74 and the first low k dielectric layer 72. Next, a second imageable 82 is deposited over the second low k dielectric layer 80. The thicknesses of the first and second low k dielectric layers 72, 80 may be approximately 7,000 Å each. The silicon-rich polymer deposited to form the first and second imageable layer 74, 82 will be deposited to a thickness of less than 400 nm and more preferably to a thickness of about 250 nm each. The resultant in structure is depicted in FIG. 4C.

The second imageable layer is patterned, as depicted in FIG. 4D, to provide a trench opening 84 that at least partially overlays the via opening 76. The patterning of the second imageable layer 82 does not consume the low k dielectric material in the second low k dielectric layer 80.

With the trench opening formed in the second imageable layer 82 and the via opening formed in the first imageable layer 74, a single etching step is performed to etch a via hole and trench 86 into the first and second low k dielectric layers 72, 80. The etch may be a simple oxygen plasma etch. At the same time, the oxygen reacts with the second imageable layer 82 to create a hard mask layer 83 by converting the silicon-rich polymer into silicon dioxide. At least some of the exposed portions of the first imageable layer 74 will also be converted to silicon dioxide, although those portions of the first imageable layer 74 covered by the second look dielectric layer 80 will not be so converted. The resultant in structure is depicted in FIG. 4E.

Following the etching through the first and second dielectric layers 72, 80 in a single step, the trench and via may be filled with conductive material 88 in a single step as well, as depicted in FIG. 4F. With the filling of the conductive materials 88, the formation of the dual damascene structure in the low k dielectric material is complete and further interconnect layers may be created on top of the damascene structure as desired.

The present invention provides a reduced step process for creating damascene structures with low k dielectric materials. This is accomplished by employing an imageable layer that is convertible to a mask layer by the same etching chemistry used to etch the low k dielectric material. At the same time, the capacitance of the interconnect arrangement is not greatly increased, nor does the mask layer need to be removed, since the layer may be made thin so as not to significantly increase the overall capacitance of the interconnect arrangement.

Although the present invention has been described and illustrated in detail, it is to be clearly understood that the same is by way of illustration and example only and is not to be taken by way of limitation, the present scope of the present invention being limited only by the terms of the appended claims.

What is claimed is:

1. A method of forming a damascene structure in a semiconductor device comprising the steps of:

forming a first low k dielectric layer;

depositing an imageable layer on the first low k dielectric layer;

composing the imageable layer of a silicon-rich photopolymer wherein the silicon-rich polymer is an acrylate polymer that includes at least 20% silicon;

patterning the imageable layer to create an opening in the imageable layer; and etching the first low k dielectric layer through the opening, wherein the etching transforms the imageable layer into a hard mask layer.

2. The method of claim 1, wherein the step of etching the first low k dielectric layer includes exposing the acrylate polymer and the first low k dielectric layer exposed through the opening in the acrylate polymer to oxygen, to thereby simultaneously etch the first low k dielectric layer and transform at least some of the imageable layer into silicon dioxide.

3. The method of claim 2, wherein the step of etching the first low k dielectric layer includes etching a via hole in the first low k dielectric layer.

4. The method of claim 3, further comprising the steps of:

filling the via hole with conductive material;

forming a second low k dielectric layer on the acrylate polymer and the conductive material in the via hole;

depositing a second imageable layer on the second low k dielectric layer;

patterning the second low k dielectric layer to create a trench opining in the second imageable layer; and etching the second low k dielectric layer through the opening, wherein the etching transforms the second imageable layer into a hard mask layer.

5. The method of claim 1, wherein the imageable layer is between about 50 nm to 400 nm thick.

6. The method of claim 5, wherein the imageable layer is about 250 nm thick.

7. A method of forming a dual damascene structure in a semiconductor device, comprising the steps of:

depositing a first imageable layer on a first low k dielectric layer;

patterning the first imageable layer to create a via opening in the first imageable layer;

depositing a second imageable layer on a second low k dielectric layer on the first imageable layer;

composing the first and second imageable layers of a silicon-rich photopolymer wherein the silicon-rich photopolymer is an acrylate polymer that includes at least 20% silicon;

patterning a second imageable layer to create a trench opening in the second imageable layer, with at least a portion of the trench opening overlaying the via opening; and etching the first and second low k dielectric layers through the trench opening and the via opening, wherein the etching transforms the second imageable layer and portion; of the first imageable layer exposed by the trench opening into a hard mask regions.

8. The method of claim 11, wherein the step of etching the first and second low k dielectric layers includes exposing the acrylate polymer in the second imageable layer and the second and first low k dielectric layers exposed through the trench opening and the via opening to oxygen, to thereby etch the first and second low k dielectric layers and simultaneously transform at least some of the first and second imageable layers into silicon dioxide.

9. The method of claim 8, further comprising filling with conductive material a via hole and a trench created in the first and second low k dielectric layers by the etching.

* * * * *